United States Patent
Mizukami et al.

(10) Patent No.: US 10,250,108 B2
(45) Date of Patent: Apr. 2, 2019

(54) MOTOR DRIVING DEVICE

(71) Applicant: FANUC CORPORATION, Yamanashi (JP)

(72) Inventors: Shinichi Mizukami, Yamanashi-ken (JP); Kiichi Inaba, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/948,035

(22) Filed: Apr. 9, 2018

(65) Prior Publication Data

US 2018/0294698 A1 Oct. 11, 2018

(30) Foreign Application Priority Data

Apr. 10, 2017 (JP) ................................ 2017-077496

(51) Int. Cl.
*H05K 1/18* (2006.01)
*H02K 11/33* (2016.01)
(Continued)

(52) U.S. Cl.
CPC .......... *H02K 11/33* (2016.01); *H01F 27/027* (2013.01); *H03K 17/567* (2013.01);
(Continued)

(58) Field of Classification Search
CPC .. H05K 1/18; H05K 7/14; H05K 7/20; H05K 7/1407; H05K 7/1432; H02M 3/335; H02M 7/02; H02M 7/537
(Continued)

(56) References Cited

U.S. PATENT DOCUMENTS 5,266,869 A * 11/1993 Usami ................ H05B 41/2885
315/170
2009/0174353 A1 7/2009 Nakamura et al.
(Continued)

FOREIGN PATENT DOCUMENTS

JP 621323 A 1/1994
JP 2001231211 A 8/2001
(Continued)

OTHER PUBLICATIONS

English Abstract and Machine Translation for Japanese Publication No. 2001-251028 A, published Sep. 14, 2001, 7 pgs.
(Continued)

*Primary Examiner* — Xiaoliang Chen
(74) *Attorney, Agent, or Firm* — Fredrikson & Byron, P.A.

(57) ABSTRACT

A motor driving device is equipped with a printed board, a plurality of secondary voltage elements mounted on the printed board and which are used only with a secondary voltage, a plurality of primary voltage elements disposed on a surface on a side opposite to a surface on which the plurality of secondary voltage elements are mounted on the printed board, and which are used only with a primary voltage that is higher than the secondary voltage, and first conductive materials, which extend from an upper portion of the printed board to control terminals (command signal input portion) of the primary voltage elements, for the purpose of transmitting command signals from the secondary voltage elements to the primary voltage elements.

5 Claims, 4 Drawing Sheets

(51) Int. Cl.
  *H05K 3/10* (2006.01)
  *H03K 17/567* (2006.01)
  *H01F 27/02* (2006.01)
  *H05K 1/02* (2006.01)
  *H03K 17/691* (2006.01)

(52) U.S. Cl.
  CPC ......... *H03K 17/691* (2013.01); *H05K 1/0254* (2013.01); *H05K 1/181* (2013.01); *H05K 3/10* (2013.01)

(58) Field of Classification Search
  USPC .................. 174/260; 263/131, 767; 361/767
  See application file for complete search history.

(56) References Cited

U.S. PATENT DOCUMENTS

| | | | | |
|---|---|---|---|---|
| 2012/0063187 A1* | 3/2012 | Sato | ................... | H02M 3/3374 363/131 |
| 2012/0307468 A1* | 12/2012 | Suzuki | ................. | H05K 7/1432 361/767 |
| 2015/0357923 A1* | 12/2015 | Nakazawa | ........ | H02M 3/33576 363/17 |
| 2016/0242308 A1* | 8/2016 | Nakazawa | ........ | H02M 3/33576 |
| 2016/0248333 A1* | 8/2016 | Nakazawa | ................ | B60L 1/00 |

FOREIGN PATENT DOCUMENTS

| | | |
|---|---|---|
| JP | 2001251028 A | 9/2001 |
| JP | 2009130967 A | 6/2009 |
| JP | 201399211 A | 5/2013 |

OTHER PUBLICATIONS

English Abstract and Machine Translation for Japanese Publication No. 2001-231211 A, published Aug. 24, 2001, 9 pgs.
English Abstract for Japanese Publication No. 2009-130967 A, published Jun. 11, 2009, 1 pg.
English Abstract and Machine Translation for Japanese Publication No. 2013-099211 A, published May 20, 2013, 16 pgs.
English Abstract and Machine Translation for Japanese Publication No. 06-021323 A, published Jan. 28, 1994, 14 pgs.

\* cited by examiner

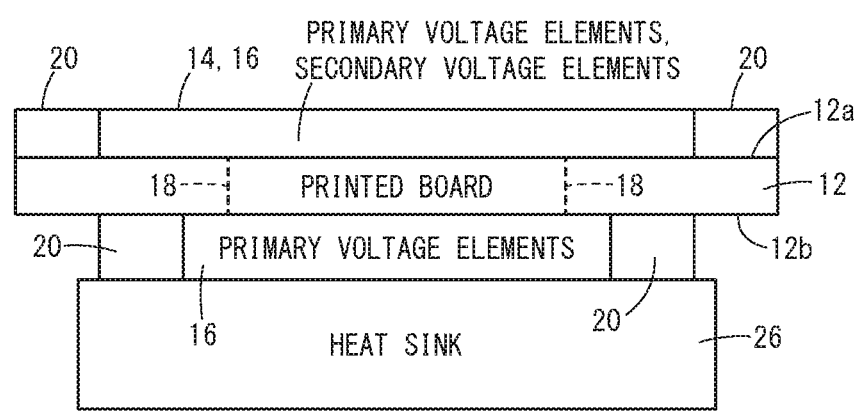
FIG. 3
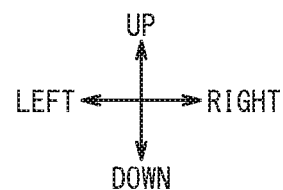

MOTOR DRIVING DEVICE

CROSS-REFERENCE TO RELATED APPLICATION

This application is based upon and claims the benefit of priority from Japanese Patent Application No. 2017-077496 filed on Apr. 10, 2017, the contents of which are incorporated herein by reference.

BACKGROUND OF THE INVENTION

Field of the Invention

The present invention relates to a motor driving device for driving a motor.

Description of the Related Art

In Japanese Laid-Open Patent Publication No. 2001-251028, a power source wiring device is disclosed, which is capable of supplying a large current to a printed board without increasing the size of the printed board. To offer a brief description thereof, the power source wiring device is created by placing insulators between a positive side conductive plate and a negative side conductive plate, and soldering the positive side conductive plate and the negative side conductive plate to the printed board.

SUMMARY OF THE INVENTION

However, in the case that primary voltage elements, which are used with a primary voltage for enabling a large current to flow, and secondary voltage elements, which are used with a secondary voltage smaller than the primary voltage, are mixed together and mounted on a front surface of a printed board, it becomes necessary to separate a region where the primary voltage elements are mounted and a region where the secondary voltage elements are mounted by a predetermined insulating distance. Therefore, problems have occurred in that the layout of the primary voltage elements and the secondary voltage elements on the printed board is restricted, together with increasing the size and scale of the printed board. Further, there is also a problem in that the secondary voltage elements malfunction due to noise generated when a large current passes through the printed board.

Such problems are incapable of being solved with the power source wiring device disclosed in Japanese Laid-Open Patent Publication No. 2001-251028.

Thus, an object of the present invention is to provide a motor driving device that suppresses an increase in the size of a printed board as well as erroneous operation of the secondary voltage elements thereof, while improving the degree of freedom in layout of the primary voltage elements and the secondary voltage elements.

An embodiment of the present invention is characterized by a motor driving device, comprising a printed board, a plurality of secondary voltage elements mounted on the printed board and configured to be used only with a secondary voltage, a plurality of primary voltage elements disposed on a surface on a side opposite to a surface of the printed board on which the plurality of secondary voltage elements are mounted, and configured to be used only with a primary voltage that is higher than the secondary voltage, and a first conductive material extending from an upper portion of the printed board to a command signal input portion of the primary voltage elements, and being configured to transmit command signals from the secondary voltage elements to the primary voltage elements, wherein a secondary voltage region on the printed board on which the plurality of secondary voltage elements are mounted, and a primary voltage region on the printed board on which the first conductive material is arranged, are separated from each other by a predetermined insulating distance.

According to the present invention, it is possible to minimize the primary voltage region on the printed board. As a result, the degree of freedom in layout of the plurality of secondary voltage elements and the plurality of primary voltage elements can be improved, together with suppressing an increase in the size of the printed board. Further, since a large current does not flow in the primary voltage region on the printed board, it is also possible to suppress malfunctioning or erroneous operation of the secondary voltage elements.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 3 is a side view showing an exemplary schematic configuration of a motor driving device according to a comparative example.

DESCRIPTION OF THE PREFERRED EMBODIMENTS

A preferred embodiment of a motor driving device according to the present invention will be presented and described in detail below with reference to the accompanying drawings.

Figure 1:
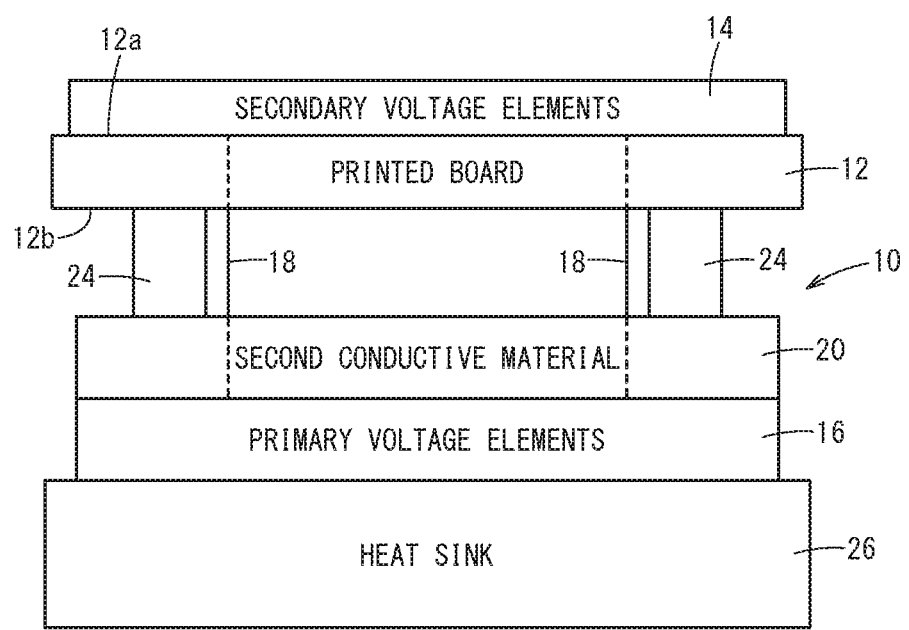
FIG. 1 is a side view showing an exemplary schematic configuration of a motor driving device according to an embodiment of the present invention.

FIG. 1 is a side view showing an exemplary schematic configuration of a motor driving device 10 according to an embodiment of the present invention. In the following description, up, down, left and right directions will be explained in accordance with the directions of the arrows shown in FIG. 1. The motor driving device 10 for driving the motor includes a printed board 12, a plurality of secondary voltage elements 14, a plurality of primary voltage elements 16, first conductive materials 18, and a second conductive material 20.

The plurality of secondary voltage elements 14 are mounted on a front surface (surface, upper surface, printed surface) 12a of the printed board 12. The secondary voltage elements 14 are elements that are used only with a secondary voltage (for example, a voltage less than or equal to 24 V). At least one of the plurality of secondary voltage elements 14 outputs command signals to a primary voltage element 16, which is a switching element that controls a driving current supplied to the motor. Each of the secondary voltage elements 14, for example, is an IC (Integrated Circuit). The secondary voltage elements 14 may be ICs with a plurality of terminals separated by an interval of a predetermined distance (for example, 2 mm) or less. Command signals from the secondary voltage elements 14 are sent via the first conductive materials 18 to the primary voltage elements 16, which are switching elements.

The plurality of primary voltage elements 16 are disposed on a side of a surface (rear surface, lower surface, solder surface) 12b opposite to the surface (front surface) 12a of the printed board 12 on which the plurality of secondary voltage elements 14 are mounted. The primary voltage elements 16 are elements that are used only with a primary voltage that is higher than the secondary voltage (for example, a voltage higher than or equal to 100 V). A large current (a current which is larger than or equal to a predetermined value) flows through the primary voltage elements 16. Therefore, the primary voltage elements 16 generate heat which is greater than or equal to a predetermined amount. The primary voltage elements 16, for example, are elements which are provided in order to supply a large driving current to the motor, and are constituted by power devices or the like.

The power devices are power semiconductor elements such as insulated gate bipolar transistors (IGBT), thyristors, rectifier diodes, or power transistors (power MOSFET). The plurality of primary voltage elements 16 may also include intelligent power modules (IPM). The IGBTs, the power MOSFETs, and the like are switching elements that operate in response to command signals output from the secondary voltage elements 14.

The first conductive materials 18 extend from control terminals (command signal input portions) of the primary voltage elements 16 to an upper portion of the printed board 12. Distal end portions of the first conductive materials 18 may be disposed on the front surface 12a of the printed board 12, or may be disposed in a state of being suspended slightly above the front surface 12a of the printed board 12.

Since the primary voltage is applied to the first conductive materials 18, the first conductive materials 18 are not directly connected to the secondary voltage elements 14, but rather, are connected to the secondary voltage elements 14 via insulating elements 22 (see FIG. 2) such as photocouplers, transformers, or the like. The insulating elements 22 transmit signals while remaining electrically insulated. The insulating elements 22 may be, for example, optically coupled insulating elements (photocouplers), magnetically coupled insulating elements (transformers), or capacitively coupled insulating elements in which capacitors are used. The insulating elements 22 provided in the present embodiment transfer only the signals by converting the secondary voltage into the primary voltage.

Accordingly, the secondary voltage command signals output from the secondary voltage elements 14 are converted by the insulating elements 22 into primary voltage command signals, and are output to the primary voltage elements 16, which are switching elements. The first conductive materials 18 function as signal lines, and therefore, a large current does not flow through the first conductive materials 18.

The second conductive material 20 is a material (for example, a bus bar) which electrically connects the primary voltage elements 16 with each other. Accordingly, a large current flows through the second conductive material 20. Therefore, the second conductive material 20 generates heat which is greater than or equal to a predetermined amount.

The second conductive material 20 is disposed on a side of the surface (rear surface) 12b opposite to the surface (front surface) 12a of the printed board 12 on which the plurality of secondary voltage elements 14 are mounted.

In FIG. 1, in relation to a vertical direction, it is shown that the second conductive material 20 is disposed on a lower side of the printed board 12, and furthermore, that the plurality of primary voltage elements 16 are disposed underneath the second conductive material 20. However, the second conductive material 20 and the plurality of primary voltage elements 16 may also be disposed while being mixed in relation to the vertical direction.

The plurality of primary voltage elements 16 and the second conductive material 20 are arranged while being separated a predetermined distance or more from the printed board 12. The plurality of primary voltage elements 16 and the second conductive material 20 are disposed on the printed board 12 via connecting members 24. The connecting members 24 are insert members which are interposed between the printed board 12 and the plurality of primary voltage elements 16 and the second conductive material 20, in order to separate the printed board 12 from the plurality of primary voltage elements 16 and the second conductive material 20. Moreover, the first conductive materials 18 may be passed through the connecting members 24.

A heat sink 26 is provided as an element for cooling the plurality of primary voltage elements 16 as well as the second conductive material 20, which generate a large amount of heat.

Figure 2:
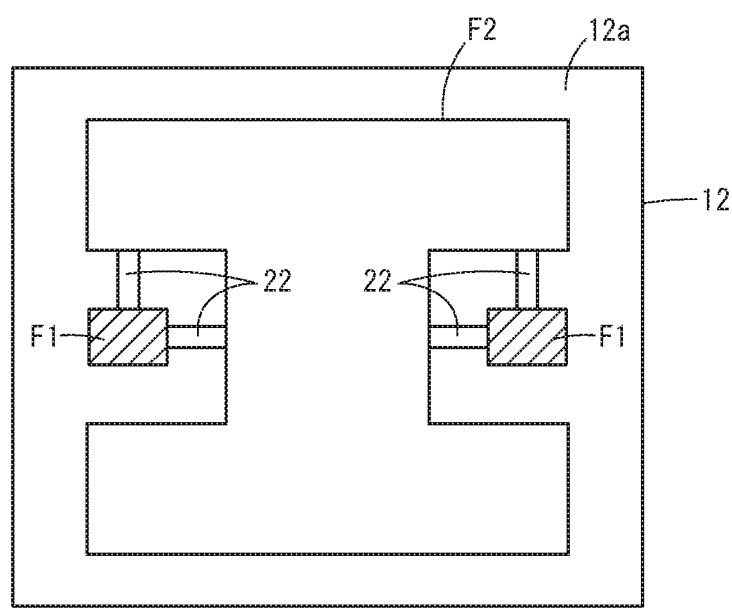
FIG. 2 is a plan view showing a secondary voltage region to which a secondary voltage is applied, and a primary voltage region to which a primary voltage is applied, on the printed board shown in FIG. 1.
Figure 2:
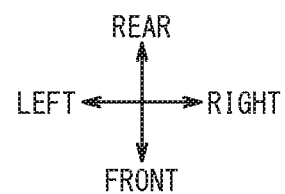

FIG. 2 is a plan view showing a secondary voltage region F2 to which the secondary voltage is applied, as well as primary voltage regions F1 to which the primary voltage is applied, on the printed board 12. The secondary voltage region F2 is a region on the printed board 12 on which the plurality of secondary voltage elements 14 are mounted. The primary voltage regions F1 are regions on the printed board 12 on which the first conductive materials 18 are disposed. As shown in FIG. 2, the secondary voltage region F2 and the primary voltage regions F1 are separated by a predetermined insulating distance. The aforementioned insulating elements 22 are disposed between the secondary voltage region F2 and the primary voltage regions F1.

Since the insulating distance can be made shorter between the primary voltage and the primary voltage (i.e., between the primary voltages themselves) than between the primary voltage and the secondary voltage, in the event there are a plurality of primary voltage regions F1, they can also be arranged in close proximity to each other.

As a comparative example, a description will be given of a case in which a plurality of secondary voltage elements 14 and a plurality of primary voltage elements 16 are disposed in a mixed manner on the printed board 12. FIG. 3 is a side view showing an exemplary schematic configuration of a motor driving device according to a comparative example. The same reference numerals are assigned to the same components as those shown in FIG. 1.

A plurality of secondary voltage elements 14 are mounted on the printed board 12. Further, a plurality of primary voltage elements 16 are disposed on the front surface 12a side of the printed board 12 as well as on the rear surface 12b side of the printed board 12. Second conductive materials 20 for connecting the primary voltage elements 16 to each other are disposed on the front surface 12a side as well as on the rear surface 12b side of the printed board 12.

Figure 4:
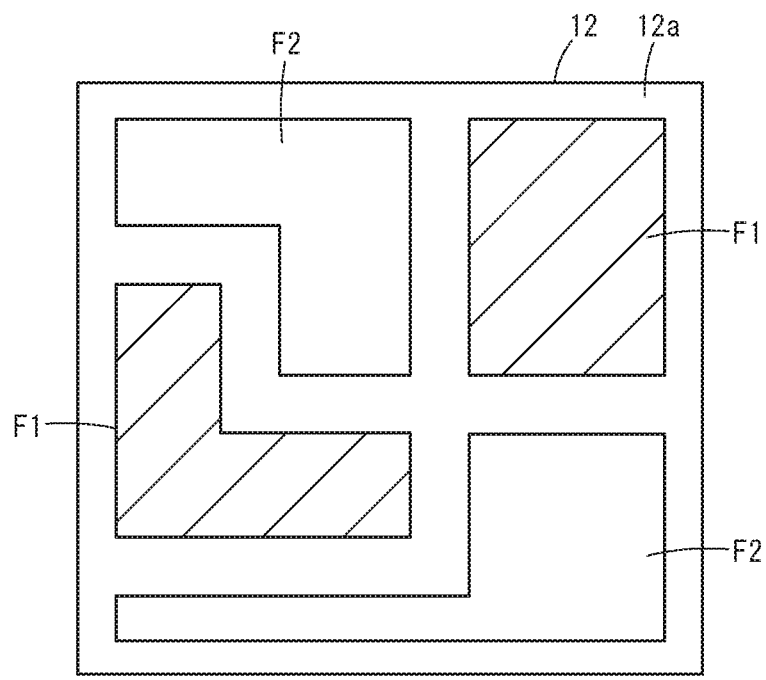
FIG. 4 is a plan view showing a secondary voltage region to which a secondary voltage is applied, and a primary voltage region to which a primary voltage is applied, on the printed board shown in FIG. 3.
Figure 4:
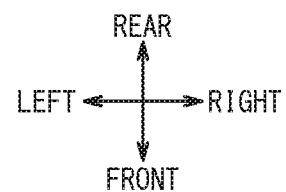

Accordingly, as shown in FIG. 4, the primary voltage regions F1 of the printed board 12 on which the plurality of primary voltage elements 16 and the second conductive materials 20 are arranged become large in size. Further, it is necessary to separate by a predetermined insulating distance the secondary voltage regions F2 on the printed board 12 where the plurality of secondary voltage elements 14 are arranged, and the primary voltage regions F1 on the printed board 12. Therefore, the degree of freedom in layout of the plurality of secondary voltage elements 14 and the plurality of primary voltage elements 16 on the printed board 12 is limited, and together therewith, the printed board 12 is disadvantageously increased in size.

Further, since a large current flows in the primary voltage regions F1 on the printed board 12, there is also a problem in that malfunctioning of the secondary voltage elements 14 tends to occur. Furthermore, because the plurality of primary voltage elements 16 and the second conductive materials 20, which are disposed on the rear surface 12b side of the printed board 12, are arranged adjacent to the printed board 12, there is a possibility for the secondary voltage elements 14 to malfunction due to a large current flowing on the rear surface 12b side of the printed board 12.

In contrast thereto, according to the present embodiment, the plurality of secondary voltage elements 14 are mounted on the front surface (upper surface, printed surface) 12a of the printed board 12, and the plurality of primary voltage elements 16 are disposed on the rear surface (lower surface, solder surface) 12b side of the printed board 12. In accordance with this feature, it is possible to minimize the primary voltage regions F1 on the printed board 12. As a result, the degree of freedom in layout of the plurality of secondary voltage elements 14 and the plurality of primary voltage elements 16 can be improved, together with suppressing an increase in the size of the printed board 12. Further, since a large current does not flow in the primary voltage regions F1 (the regions where the first conductive materials 18 are disposed) on the printed board 12, it is possible to suppress malfunctioning of the secondary voltage elements 14.

Further, since the second conductive material 20 through which the large current flows is provided on the rear surface 12b side of the printed board 12, it is possible to further suppress malfunctioning of the secondary voltage elements 14. Moreover, although it is not preferred to do so, a portion of the second conductive material 20 may be provided on the front surface 12a side of the printed board 12.

Furthermore, since the plurality of primary voltage elements 16 and the second conductive material 20 through which a large current flows are arranged at a predetermined distance or more away from the printed board 12, it is possible to further suppress malfunctioning or erroneous operation of the secondary voltage elements 14. Moreover, although it is not preferred to do so, portions of the plurality of primary voltage elements 16 and the second conductive material 20 may be arranged adjacent to the rear surface 12b of the printed board 12.

[Technical Concepts Obtained from the Embodiments]

Technical concepts which can be grasped from the above-described respective embodiments will be described below.

The motor driving device (10) is equipped with the printed board (12), the plurality of secondary voltage elements (14) mounted on the printed board (12) and configured to be used only with the secondary voltage, the plurality of primary voltage elements (16) disposed on the surface (12b) on a side opposite to the surface (12a) of the printed board (12) on which the plurality of secondary voltage elements (14) are mounted, and configured to be used only with a primary voltage that is higher than the secondary voltage, and the first conductive material (18) extending from an upper portion of the printed board (12) to control terminals (the command signal input portion) of the primary voltage elements (16), and being configured to transmit command signals from the secondary voltage elements (14) to the primary voltage elements (16). The secondary voltage region (F2) on the printed board (12) on which the plurality of secondary voltage elements (14) are mounted, and the primary voltage region (F1) on the printed board (12) on which the first conductive material (18) is arranged, are separated from each other by a predetermined insulating distance.

In accordance with these features, it is possible to minimize the primary voltage regions (F1) on the printed board (12). As a result, the degree of freedom in layout of the plurality of secondary voltage elements (14) and the plurality of primary voltage elements (16) can be improved, together with suppressing an increase in the size of the printed board (12). Further, since a large current does not flow in the primary voltage regions (F1) on the printed board (12), it is also possible to suppress malfunctioning of the secondary voltage elements (14).

The motor driving device (10) may be provided with the second conductive material (20) which connects the primary voltage elements (16) with each other. The second conductive material (20) may be disposed on the side of the surface (12b) opposite to the surface (12a) of the printed board (12) on which the plurality of secondary voltage elements (14) are mounted. In accordance with this feature, it is possible to further suppress malfunctioning of the secondary voltage elements (14).

The plurality of primary voltage elements (16) and the second conductive material (20) may be separated a predetermined distance or more from the printed board (12). In accordance with this feature, it is possible to further suppress malfunctioning of the secondary voltage elements (14).

The insulating element (22) may be disposed between the secondary voltage region (F2) and the primary voltage region (F1). In accordance with this feature, command signals from the secondary voltage elements (14) can be transmitted to the primary voltage elements (16) while being insulated. Moreover, the insulating element (22) may be a photocoupler or a transformer.

The present invention is not limited to the above described embodiments. It is a matter of course that various modifications can be made without departing from the gist of the present invention.

What is claimed is:

1. A motor driving device, comprising:
   a printed board;
   a plurality of secondary voltage elements mounted on the printed board and configured to be used only with a secondary voltage;
   a plurality of primary voltage elements disposed on a surface on a side opposite to a surface of the printed board on which the plurality of secondary voltage elements are mounted, and configured to be used only with a primary voltage that is higher than the secondary voltage; and
   a first conductive material extending from an upper portion of the printed board to a command signal input portion of the primary voltage elements, and being configured to transmit command signals from the secondary voltage elements to the primary voltage elements,
   wherein a secondary voltage region on the printed board on which the plurality of secondary voltage elements are mounted, and a primary voltage region on the printed board on which the first conductive material is arranged, are separated from each other by a predetermined insulating distance.

2. The motor driving device according to claim 1, further comprising:
a second conductive material which connects the primary voltage elements with each other;
wherein the second conductive material is disposed on the side of the surface opposite to the surface of the printed board on which the plurality of secondary voltage elements are mounted.

3. The motor driving device according to claim 2, wherein the plurality of primary voltage elements and the second conductive material are separated a predetermined distance or more from the printed board.

4. The motor driving device according to claim 1, wherein an insulating element is disposed between the secondary voltage region and the primary voltage region.

5. The motor driving device according to claim 4, wherein the insulating element is a photocoupler or a transformer.

* * * * *